United States Patent [19]

Swailes

[11] Patent Number: 5,378,857
[45] Date of Patent: Jan. 3, 1995

[54] DIRECTLY BONDABLE TERMINATION FOR A FIXED DISCRETE WIRE

[75] Inventor: John T. Swailes, Kings Park, N.Y.

[73] Assignee: Advanced Interconnection Technology, Inc., Islip, N.Y.

[21] Appl. No.: 4,991

[22] Filed: Jan. 15, 1993

[51] Int. Cl.⁶ .............................. H05K 1/02
[52] U.S. Cl. ................... 174/251; 174/261; 361/774
[58] Field of Search .............. 174/251, 261, 267; 361/774

[56] References Cited

U.S. PATENT DOCUMENTS

| | | |
|---|---|---|
| 3,969,816 | 7/1976 | Swengel, Jr. et al. ............ 29/625 |
| 3,996,416 | 12/1976 | Lemke . |
| 4,450,623 | 5/1984 | Burr . |
| 4,646,436 | 3/1987 | Crowell et al. ................ 174/251 |
| 4,679,321 | 7/1987 | Plonski ......................... 29/850 |
| 4,693,778 | 9/1987 | Swiggett ..................... 29/738 X |
| 4,743,710 | 5/1988 | Shieber et al. . |
| 4,908,939 | 3/1990 | Shieber et al. . |
| 5,250,759 | 10/1993 | Watson ........................ 174/261 |

Primary Examiner—Leo P. Picard
Assistant Examiner—L. Thomas
Attorney, Agent, or Firm—Morgan & Finnegan

[57] ABSTRACT

An apparatus and method for wire termination in wire scribed circuit boards is provided. The system includes a plurality of wires having termination areas, scribed on an insulating substrate. The top portion of the termination areas is then removed by a router to expose the wire with a flat surface. The exposed portion of the wire is then covered by a metal suitable for electrical connection bonding.

12 Claims, 2 Drawing Sheets

DIRECTLY BONDABLE TERMINATION FOR A FIXED DISCRETE WIRE

BACKGROUND

This invention relates to a wire scribed circuit board product and method of manufacturing thereof. More specifically this invention relates to a method and device wherein conductive filaments fixed to a substrate are terminated in such a way that an electronic, electro-optical and/or an optical device may be appropriately soldered, bonded, or wire bonded or otherwise connected directly to the conductive filament.

In recent times the electronics industry has moved toward more compact integrated circuit packages with surface-mounted terminals. The density of wiring patterns have substantially increased within the recent past. Many circuit board applications today utilize insulated wires in order to cross the wires over each other, thereby allowing signal paths to run in both X and Y directions on the same layer without the use of via holes.

Although the use of via holes may be avoided, interconnections from wire ends to component pads on the surface are effected by plated through holes. A wire scribed circuit boards can be produced by following the methods described in U.S. Pat. No. 3,674,914. According to previous methods an isolated wire is scribed onto an insulating base by feeding a continuous strand of wire on to the surface of the base while simultaneously affixing the wire to the base thereby producing a wire image of a predetermined interconnect pattern. Holes are subsequently drilled at the terminal points intersecting the termination points of the conductors. The holes are then metallized to electrically connect the termination points of the conductors to surface terminal pads or later added components. As a result the signal path is discontinued when the wire is first connected to the plated metal, and eventually the added component is coupled to the plated metal in the through hole. Furthermore, through holes must be cleaned and chemically etched to provide good adhesion for the copper plating, and to remove the insulation on the exposed wire end in the hole wall.

Another type of wire used for scribing on circuit boards is coaxial wire which is the preferred transmission medium for high frequency signals. Because many of today's circuit boards are designed for very high frequency signals, the signal paths must be treated as transmission paths with the same characteristics such as impedance, cross talk, and propagation delay. Therefore the use of coaxial wires has become appropriate for such high frequency signal applications. A coaxial conductor includes a signal conductor covered by an insulating medium. The signal conductor and the insulating medium are protected by a shield which is electrically connected to the reference potential or ground. A coaxial conductor contains all of the signal energy inside its shield on the signal conductor. The shield isolates the signal conductor from the surrounding environment, thus providing a clean uniform environment for signal travel. The shield prevents radiation of energy from the signal conductor which improves signal propagation and reduces electrical interference which may affect other signals in the vicinity.

The process described above is not applicable if coaxial conductors are used as the interconnect medium. The signal conductor and shield would become electrically connected or "shorted" at the terminal points. An example of a termination method for coaxial wires is disclosed in U.S. Pat. No. 4,908,939 "Method Of Making Coaxial Interconnection Boards" by Shieber, et al and U.S. Pat. No 4,743,710 "Coaxial Interconnection Boards" by Shieber, wherein coaxial conductors are scribed onto a circuit board substrate such that the shorting problem would be avoided.

In accordance to previous teachings, the coaxial conductors are preformed and affixed in a predetermined pattern on the substrate using an adhesive. A conductive layer forming a ground plane covers the surface of the substrate interconnecting the shields of the coaxial conductors. The intermediate feature includes the step of eliminating the conductive material other than the coaxial signal conductor, around the termination points of the coaxial conductors to provide clearance areas. The clearance then permits connection of the signal conductors to surface terminal pads without shorting to the shield conductors or ground plane.

Another example for providing terminations for coaxial wires is disclosed in U.S. Pat. No. 4,679,321 "Method For Making Coaxial Interconnection Boards" by Plonski. According to the disclosure an interconnection board for high frequency signals is made by wire scribing coaxial conductors. The board is provided with holes. The coaxial conductor with signal conductor surrounded by a dielectric insulator surrounded by a conductive shield are wire scribed on a first surface of the board. The intermediate feature includes the step of stripping the ends of the coaxial conductors to expose signal conductor sections, and dielectric sections. The stripped ends are inserted through the holes such that the dielectric sections reside in the holes and the exposed conductors protrude through the holes on the second surface of the board. The signal conductors are terminated on the second surface, and the conductive shields are connected together on the first surface.

Previous methods of conductor termination, some of which are discussed above, relied on an intermediate feature such as a plated-through hole, a plated blind laser via and plated surface bonding pads to connect the wire conductor to the electronic device. The intermediate features discussed above produce discontinuities in the signal path that may be detrimental to the performance of high speed electronic circuits. Furthermore, on circuits with shielded conductors, the intermediate features represent non-shielded areas which reduce the advantages of the shielding. These features also require more complex processing methods such as drilling and plating for providing through holes from the surface of the board to the signal conductor. The transitions from the signal conductor to plated copper and the surface feature are the areas most likely to fail. Therefore, although insulated wires in general and coaxial conductors in particular are recognized as a preferred interconnect medium where high signal switching speeds are involved, there is a need for an improved termination process to avoid some of the steps involved in providing terminations in accordance with previous methods and systems.

SUMMARY OF THE INVENTION

It is therefore an object of the invention to provide an apparatus and method for terminating a conductive filament fixed to a substrate for soldering or bonding an electronic, electro-optical and/or an optical device directly to the conductive filament. Conductive filament refers to filaments containing at least one conductive portion, i.e., a portion which can act as a conductor, e.g., an electrical conductor or wire, an optical conductor or fiber or the like. The conductive portion of the filament may or may not have a dielectric coating and/or an energizable adhesive surface for bonding the filaments.

It is another object of the invention to reduce discontinuities in the signal path of a conductive filament fixed on a substrate.

It is also an object of the invention to reduce the length of non-shielded portion of a conductive filament and a substrate.

It is also an object of the invention to provide reliable wire terminations on a substrate with a simple process.

According to one embodiment of the invention a conductive filament is bonded to a substrate. The conductive filament can be bare, insulated or coaxial. A mechanical router with depth control is used to remove the top portion of the conductive filament to form a termination. As a result, a termination portion of the conductive filament with a flat surface on the conductive portion is created. The flat portion of the conductive portion can then, if so desired, be covered with suitable material to provide suitable bonding for electrical electro-optical or optical connections.

DETAILED DESCRIPTION OF THE INVENTION

Figure 1:
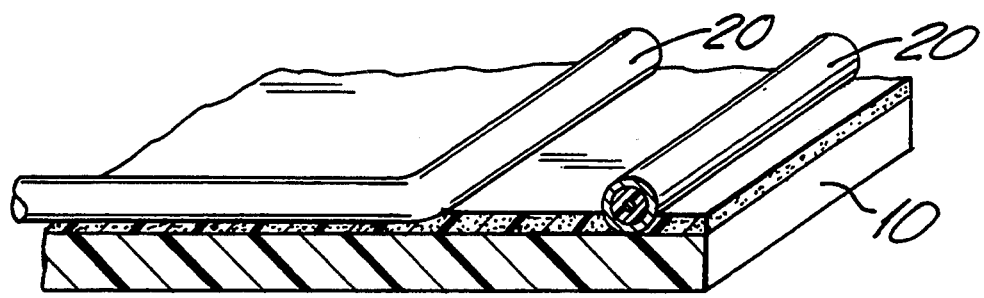
FIG. 1 is a plan view of a circuit board with scribed conductor wires.

FIG. 1 illustrates one example of a wire 20 which is scribed on a substrate 10. Wire scribed circuit boards can be produced automatically using the method described in U.S. Pat. No. 4,693,778 by Swiggett et al. In this process an insulated wire is scribed onto an insulating base 10 by feeding a continuous strand of wire onto the surface of the base while simultaneously affixing the wire to the base and thereby producing a wire image of a predetermined interconnect pattern. There can be many wires on the substrate forming a circuit board. Alternatively, the invention may also comprise a circuit board having a scribed signal conductor layer of other conductive filaments besides wire, like optical fibers.

Figure 2:
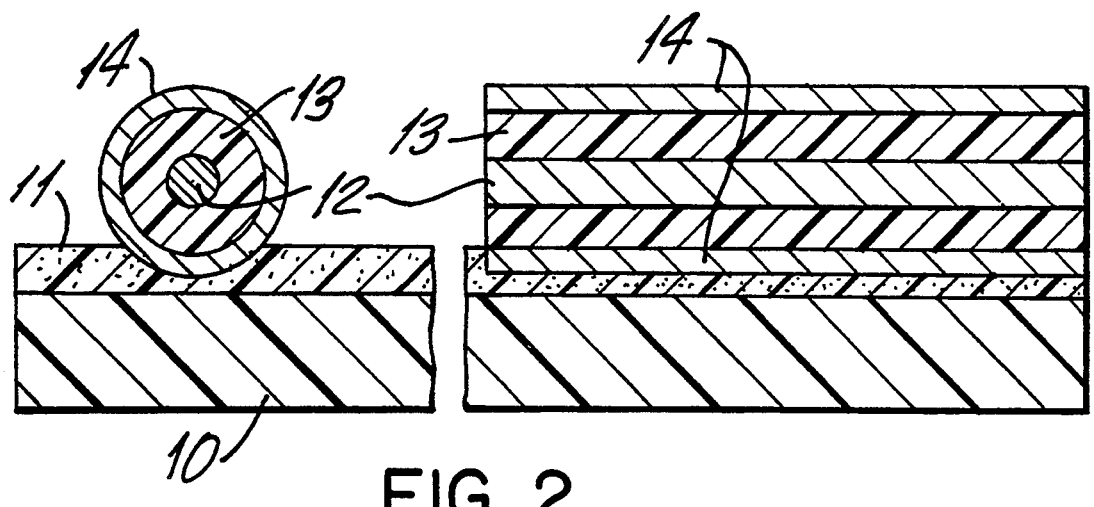
FIG. 2 illustrates the front and side views of a conductor wire scribed on a circuit board.

FIG. 2 illustrates a two dimensional view of the wire with the front and the side view of the same wire shown next to each other. The termination method according to this invention may be used on any kind of wire which is fixed and bonded to the substrate 10. An example of substrate 10 is FR-4 epoxy/glass laminate. An example of a wire is a coaxial wire 20, having a signal conductor 12, an insulation 13 surrounding the signal conductor and a shielding 14 on the coaxial wire which can be any conductive material. Wire 20 is bonded to the substrate 10 by an adhesive 11. A preferable adhesive for this purpose is RC-210 plating adhesive. The bonding of the wire to the substrate may be accomplished by using a machine specifically designed to scribe wire onto a substrate in a predetermined pattern.

Typically the wire 20 is tacked in place in the adhesive coating 11 as shown in FIG. 2. This can be accomplished using the general method disclosed in the U.S. Pat. No. 4,693,778 by Swiggett et al., where the board is mounted on an X-Y table and the wire is dispensed from a scribing head. Adhesive layer 11 is activated along the conductor path by applying energy locally, such as ultrasonic energy, to activate the adhesive. The cross section of the signal conductor 12 may be of any shape. Furthermore, it can be appreciated that wire 20 may be replaced by a bare wire, an insulated wire or any other type of conductive filament. However, for coaxial wires, the insulation 13 may be any suitable material such as "TEFLON®" (which is a trademark of E. I. DuPont de Nemours & Co.). The shielding 14 on the coaxial wire may be any conductive material such as copper.

Figure 3:
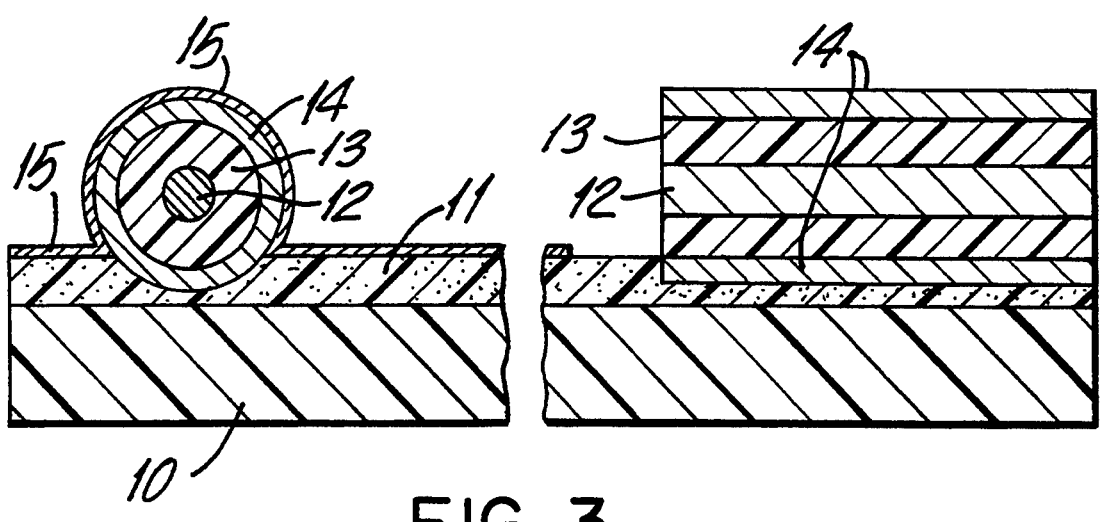
FIG. 3 illustrates the front and side views of a conductor wire with an additional conductor shield covering its outer surface.

In some applications the insulated or coaxial wire 20 may have an additional shield layer 15 as illustrated in FIG. 3, covering the wire. The shield might be applied by using conventional printed circuit techniques of adhesion promoting and plating the surface. As indicated hereinabove, it can be appreciated by those skilled in the art that other conductive filaments including optical fibers may be utilized instead of coaxial wire 20.

Figure 4:
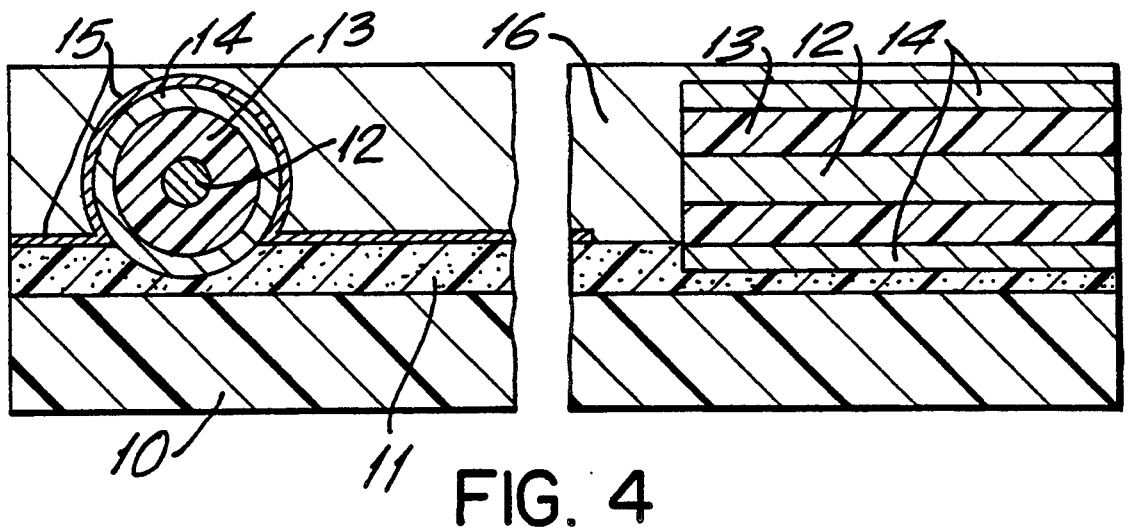
FIG. 4 illustrates the front and side views of the conductor depicted in FIG. 3, imbedded in an epoxy substrate.

Furthermore, as illustrated in FIG. 4, wire 20 whether shielded or not may be encapsulated by an epoxy type encapsulant 16 to form a ground plane interconnecting all of the conductive shields. A suitable material is EPO-TEK from Epoxy Technology, Inc. which is epoxy filled with silver flakes (4 parts metal to 1 part epoxy).

Figure 5:
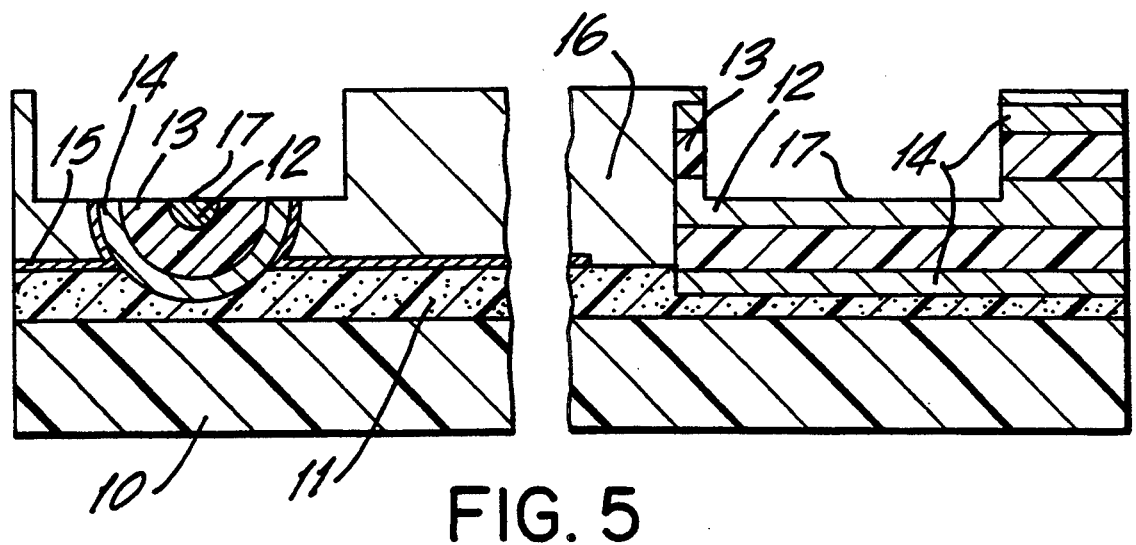
FIG. 5 illustrates the conductor of FIG. 4 terminated with a flat upper surface.

In order to form a termination according to the present invention the upper top of wire 20 may be removed. This may be accomplished by a mechanical tool such as a numerically controlled CNC router with depth control. In one example of the preferred embodiment the wire 20 includes the conduction signal 12, the insulator 13 covering the conductor signal, conductive shield 14, shield layer 15 covering the wire and encapsulant 16 covering the wire 20 as illustrated in FIG. 4. The top portion of the wire assembly as described may be removed by an ATI/CNC router using a 0.125" diameter 4 flute end mill at a spindle speed of 24000 rpm and a route speed of 30 in./min. The result is a flat surface 17 on the signal conductor as shown in FIG. 5. The side view illustration of wire 20 shows that the length of the flat portion at the end of wire 20 is relatively small.

Figure 6:
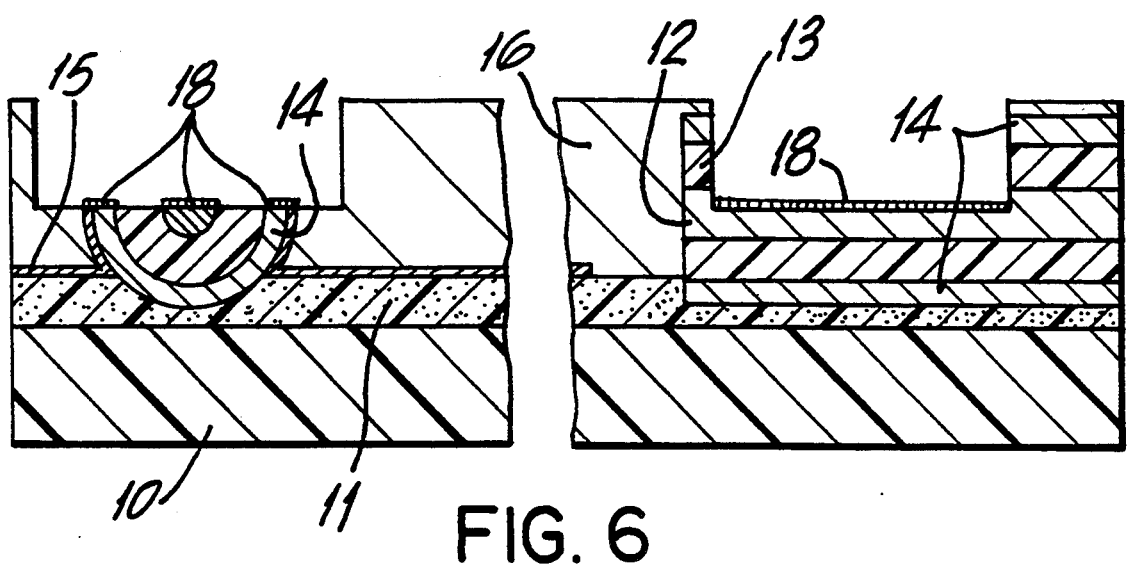
FIG. 6 illustrates the conductor of FIG. 5 wherein the signal conductor and the conductor shields are covered with a metal for bonding to electric devices.

Thereafter as illustrated in FIG. 6 the flat surface 17 of the conductor is covered with another metal 18 by a variety of known techniques such as hot air levelling of solder or electroless plating or electroplating of nickel/gold so that bonding the appropriate electrical connection directly to the wire could be easily accomplished. The board can be routed or fabricated in any way necessary to allow a direct connection from the device to the wire or to the wire and the shield.

It can be appreciated that the wire termination process described above is applicable to any kind of conductive filament and in many applicable circumstances.

The invention is more particularly defined in the appended claims.

I claim:

1. A conductor termination apparatus comprising:
a substrate, having a top surface and a bottom surface, for mounting components thereon;
a plurality of conductive filaments that are adhesively bonded in a predetermined pattern to said top surface of said substrate so that said plurality of conductive filaments lie in an X-Y plane substantially parallel to said top surface, where said plurality of conductive filaments do not penetrate said substrate in a Z-direction between said top surface and said bottom surface;
where each of said plurality of conductive filaments have a conductive portion for transmitting a signal, and a termination area;
wire removal means for removing an upper top portion of said termination area of said conductive filaments to thereby form and expose a termination portion of said conductive portion; and
where said termination portion is substantially parallel to said top surface and is capable of connecting to one of said components without a metallized hole intermediary.

2. The conductor termination apparatus of claim 1, wherein said components may be one of the following type devices: electrical, electro-optical and optical.

3. The conductor termination apparatus of claim 1, wherein said wire removal means includes a router with depth control.

4. The conductor termination apparatus of claim 3, wherein said conductive filament is wire and said conductive portion corresponds to a wire conductor.

5. The conductor termination apparatus of claim 4 further comprising means for covering said termination portion of said wire conductor with a metal suitable for electrical connection bonding.

6. The conductor termination apparatus of claim 5, wherein said wire is a coaxial wire having said wire conductor covered by an insulator, said wire conductor and said insulator being further covered by a conductive shield.

7. The conductor termination apparatus of claim 6, wherein said coaxial wire is further covered by a shield layer.

8. The conductor termination system of claim 6, wherein said coaxial wire is encapsulated with an epoxy-type encapsulant.

9.. The conductor termination system of claim 7, wherein said coaxial wire and shield layer are covered by an epoxy-type encapsulant.

10. A circuit board comprising:
a substrate, having a top surface and a bottom surface, for mounting components thereon;
a plurality of conductive filaments that are adhesively bonded in a predetermined pattern to said top surface of said substrate so that said plurality of conductive filaments lie in an X-Y plane substantially parallel to said top surface, where said plurality of conductive filaments do not penetrate said substrate in a Z-direction between said top surface and said bottom surface;
where each of said plurality of conductive filaments have a conductive portion for transmitting a signal, and a termination area;
where said termination area of said conductive filaments have an exposed termination portion of said conductive portion; and
where said termination portion is substantially parallel to said top surface and is capable of connecting to one of said components without a metallized hole intermediary.

11. The circuit board of claim 10, wherein said termination portion results from removing an upper top portion of said conductive filament in said termination area.

12. The circuit board of claim 11, wherein said upper top portion of said conductor is removed by a router with depth control for exposing said conductive portion of said conductive filament.

* * * * *